United States Patent
Tseng et al.

(10) Patent No.: US 8,455,877 B2
(45) Date of Patent: Jun. 4, 2013

(54) THIN FILM TRANSISTOR ARRAY SUBSTRATE

(75) Inventors: Chin-An Tseng, Hsin-Chu (TW); Hung-Lung Hou, Hsin-Chu (TW); Chia-Yu Lee, Hsin-Chu (TW); Chieh-Wei Chen, Hsin-Chu (TW); Kung-Ching Chu, Hsin-Chu (TW); Yen-Heng Huang, Hsin-Chu (TW); Chung-Kai Chen, Hsin-Chu (TW); Yi-Tsun Lin, Hsin-Chu (TW); Chun-Jen Chiu, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 13/433,660

(22) Filed: Mar. 29, 2012

(65) Prior Publication Data

US 2012/0181541 A1    Jul. 19, 2012

Related U.S. Application Data

(62) Division of application No. 12/683,842, filed on Jan. 7, 2010, now abandoned.

(30) Foreign Application Priority Data

Mar. 19, 2009   (TW) ............................... 98108983 A (51) Int. Cl.
    *H01L 29/04*    (2006.01)
(52) U.S. Cl.
    USPC ............................. 257/72; 257/59; 438/158

(58) Field of Classification Search
    USPC .................. 257/59, 72, E21.002; 349/39–44, 349/147; 438/30, 158
    See application file for complete search history.

(56) References Cited

U.S. PATENT DOCUMENTS

| 5,771,083 | A |   | 6/1998  | Fujihara et al. |
|-----------|---|---|---------|------------------|
| 5,847,781 | A |   | 12/1998 | Ono et al. |
| 5,903,055 | A |   | 5/1999  | Takayama |
| 5,943,105 | A |   | 8/1999  | Fujikawa et al. |
| 5,976,902 | A |   | 11/1999 | Shih |
| 6,137,552 | A | * | 10/2000 | Yanai ............................ 349/44 |
| 6,218,206 | B1 |   | 4/2001  | Inoue et al. |
| 6,262,784 | B1 | * | 7/2001  | Kim ................................ 349/43 |
| 6,362,028 | B1 | * | 3/2002  | Chen et al. .................... 438/149 |

(Continued)

FOREIGN PATENT DOCUMENTS

| CN | 1560687 | 1/2005 |
| CN | 1940687 | 4/2007 |

(Continued)

OTHER PUBLICATIONS

English language translation of abstract of TW 255363 (published May 21, 2006).

(Continued)

*Primary Examiner* — William F Kraig
(74) *Attorney, Agent, or Firm* — McClure, Qualey & Rodack, LLP (57) ABSTRACT

A thin film transistor (TFT) array substrate includes a stack structure disposed to raise an extended electrode of a drain electrode of a thin film transistor. Therefore, a contact hole does need to be very deep to expose the extended electrode of the drain electrode.

21 Claims, 7 Drawing Sheets

U.S. PATENT DOCUMENTS

| | | | |
|---|---|---|---|
| 6,466,279 B1 * | 10/2002 | Nakata | 349/42 |
| 6,525,788 B1 | 2/2003 | Nakagawa et al. | |
| 6,876,404 B2 * | 4/2005 | Park et al. | 349/38 |
| 6,940,566 B1 | 9/2005 | Rho et al. | |
| 6,982,769 B2 | 1/2006 | Ishino | |
| 7,262,085 B2 | 8/2007 | Gotoh et al. | |
| 7,351,623 B2 | 4/2008 | Ahn | |
| 7,379,135 B2 | 5/2008 | Lin et al. | |
| 7,622,809 B2 | 11/2009 | Gotoh et al. | |
| 8,044,399 B2 | 10/2011 | Hino et al. | |
| 8,068,205 B2 * | 11/2011 | Ahn | 349/152 |
| 8,072,565 B2 * | 12/2011 | Ahn et al. | 349/114 |
| 8,189,162 B2 * | 5/2012 | Ahn et al. | 349/152 |
| 8,299,469 B2 * | 10/2012 | Chang | 257/72 |
| 2002/0057248 A1 * | 5/2002 | Matsushima | 345/92 |
| 2003/0053005 A1 * | 3/2003 | Song et al. | 349/43 |
| 2005/0253984 A1 * | 11/2005 | Kim et al. | 349/106 |
| 2007/0070279 A1 | 3/2007 | Sugiyama et al. | |
| 2008/0135845 A1 | 6/2008 | Heo et al. | |
| 2010/0019246 A1 | 1/2010 | Kim et al. | |
| 2012/0119229 A1 * | 5/2012 | Kim et al. | 257/88 |

FOREIGN PATENT DOCUMENTS

| | | |
|---|---|---|
| JP | 2002329726 | 11/2002 |
| KR | 2005068457 A | 7/2005 |
| KR | 2007071296 A | 7/2007 |
| TW | 255363 | 5/2006 |

OTHER PUBLICATIONS

English language translation of abstract of CN 1560687 (published Jan. 5, 2005).

English language translation of abstract and pertinent part of CN 1940687 (published Apr. 4, 2007).

English language translation of abstract and pertinent parts of JP 2002329726 (published Nov. 15, 2002).

Pertinent parts of U.S. Patent No. 6,940,566 B1 (cited in foreign Office Action).

* cited by examiner

THIN FILM TRANSISTOR ARRAY SUBSTRATE

RELATED APPLICATIONS

The present application is a divisional of U.S. application Ser. No. 12/683,842, filed on Jan. 7, 2010, which was based on, and claims priority from, Taiwan Patent Application Serial Number 98108983, filed Mar. 19, 2009, the disclosure of which is hereby incorporated by reference herein in its entirely.

BACKGROUND

1. Field of Invention

The present invention relates to a display apparatus. More particularly, the present invention relates to a liquid crystal display (LCD).

2. Description of Related Art

With respect to a LCD, a pixel aperture ratio directly affects the utilization rate of a backlight source, and also affects the display brightness of the LCD. One of the major factors affecting the pixel aperture ratio is the area of a contact hole disposed on a thin film transistor (TFT) array substrate. Generally speaking, if the area of the contact hole is smaller, the area of a pixel region will be larger, and also the pixel aspect ratio will be larger.

However, due to the limitation of the current etching technique, if the area of the contact hole is too small, the contact hole in general cannot pass through an insulation layer smoothly. Particularly, with respect to a COA (Color Filter On Array) structure or an UHA (Ultra High Aperture) structure, since it is very difficult for the current etching technique to fabricate a contact hole having a high aspect ratio on a color resist, the contact hole has to be designed to have a sufficiently large area so as to ensure a certain yield level. However, this design will definitely affect the pixel aperture ratio. Hence, a designer is usually trapped in this dilemma and cannot have a breakthrough.

SUMMARY

An aspect of the present invention is to provide a TFT array substrate in which a stack structure is used to raise an extended electrode of a drain electrode of a TFT, and thus a contact hole does not need to be very deep for exposing the extended electrode of the drain electrode to contact a pixel electrode.

According to an embodiment of the present invention, a TFT array substrate includes a substrate, a first patterned conductive layer, a first insulation layer, a semiconductor layer, a second patterned conductive layer, a second insulation layer, a contact hole, and a pixel electrode. The first patterned conductive layer is disposed on the substrate, and includes a scan line, a gate electrode, and a float electrode, wherein the gate electrode is electrically connected to the scan line. The first insulation layer is disposed on the first patterned conductive layer. The semiconductor layer is disposed on the first insulation layer, and includes a channel area. The second patterned conductive layer is disposed on the first insulation layer, and includes a source electrode, a drain electrode, a data line crossing the scan line, and an extended electrode of the drain electrode. The gate electrode, the source electrode, the drain electrode, and the channel area constructs a TFT, wherein the source electrode is electrically connected to the data line, and the extended electrode of the drain electrode is partially overlapped with the float electrode. The second insulation layer is disposed on the second patterned conductive layer. The contact hole passes through the second insulation layer and exposes a portion of the extended electrode of the drain electrode. The pixel electrode is electrically connected to the extended electrode of the drain electrode through the contact hole.

According to another embodiment of the present invention, a TFT array substrate includes a substrate, a first patterned conductive layer, a first insulation layer, a semiconductor layer, a second patterned conductive layer, a second insulation layer, a contact hole, and a pixel electrode. The first patterned conductive layer is disposed on the substrate, and includes a scan line and a gate electrode, wherein the gate electrode is electrically connected to the scan line. The first insulation layer is disposed on the first patterned conductive layer. The semiconductor layer is disposed on the first insulation layer, and includes a channel area and a first semiconductor area. The second patterned conductive layer is disposed on the first insulation layer, and includes a source electrode, a drain electrode, a data line crossing the scan line, and an extended electrode of the drain electrode. The gate electrode, the source electrode, the drain electrode, and the channel area constructs a TFT, wherein the source electrode is electrically connected to the data line, and the extended electrode of the drain electrode is partially overlapped with the first semiconductor area. The second insulation layer is disposed on the second patterned conductive layer. The contact hole passes through the second insulation layer and exposes a portion of the extended electrode of the drain electrode. The pixel electrode is electrically connected to the extended electrode of the drain electrode through the contact hole.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
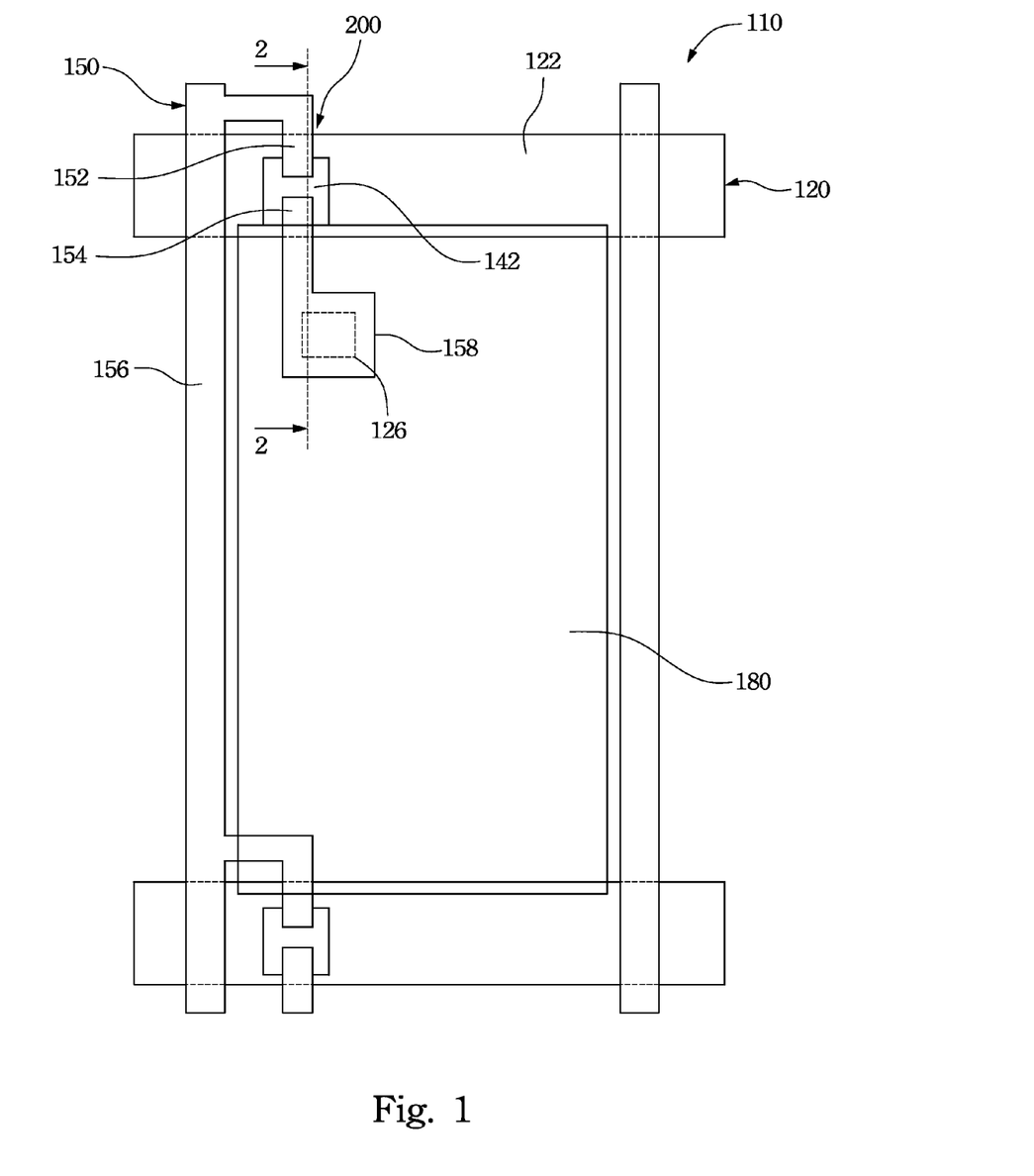
FIG. 1 is a schematic top view showing a TFT array substrate according to an embodiment of the present invention.
Figure 2:
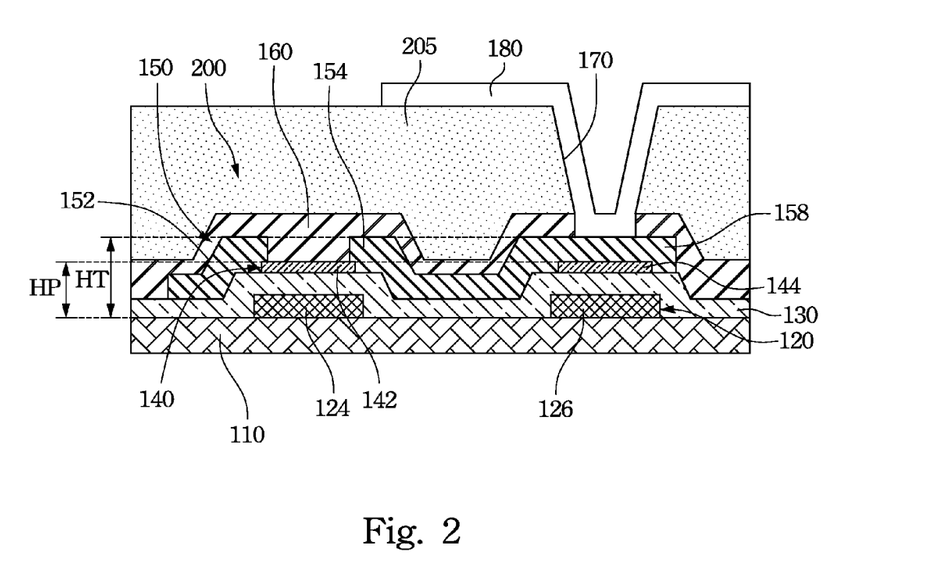
FIG. 2 is a schematic cross-sectional diagram viewed along line 2-2 in FIG. 1.

FIG. 1 is a schematic top view showing a TFT array substrate according to an embodiment of the present invention, and FIG. 2 is a schematic cross-sectional diagram viewed along line 2-2 in FIG. 1. As shown in FIG. 1 and FIG. 2, the TFT array substrate includes a substrate 110, a first patterned conductive layer 120, a first insulation layer 130, a semiconductor layer 140, a second patterned conductive layer 150, a second insulation layer 160, a contact hole 170, and a pixel electrode 180.

The first patterned conductive layer 120 is disposed on the substrate 110, and includes a scan line 122 (as shown in FIG. 1), a gate electrode 124, and a float electrode 126, wherein the gate electrode 124 is electrically connected to the scan line 122 (as shown in FIG. 1). The material forming the substrate 110 can be such as glass or plastic. The material forming the first patterned conductive layer 120 can be metal such as aluminum, copper, silver, gold, or any combination thereof, or alloy thereof.

The first insulation layer 130 is disposed on the first patterned conductive layer 120. Concretely speaking, the first insulation layer 130 can at least cover the gate electrode 124 as a gate dielectric layer of a TFT 200. The material forming the first insulation layer 130 can be one of various dielectric materials such as silicon dioxide, silicon nitride, and silicon oxynitride, or any combination thereof.

The semiconductor layer 140 is disposed on the first insulation layer 130, and includes a channel area 142. Concretely speaking, the channel 142 can be disposed above the gate electrode 124, and opposite to the gate electrode 124 with the first insulation layer 130 sandwiched therebetween.

The second patterned conductive layer 150 is disposed on the first insulation layer 130, and includes a source electrode 152, a drain electrode 154, a data line 156 crossing the scan line 122 (as shown in FIG. 1), and an extended electrode 158 of the drain electrode 154. The gate electrode 124, the source electrode 152, the drain electrode 154, and the channel area 142 constructs the TFT 200, wherein the source electrode 152 is electrically connected to the data line 156 (as shown in FIG. 1), and the extended electrode 158 of the drain electrode 154 is partially overlapped with the float electrode 126. Detailedly speaking, at least one portion of the extended electrode 158 of the drain electrode 154 is stacked above the float electrode 126, i.e. a portion of the extended electrode 158 of the drain electrode 154 overlaps the float electrode 126 with the first insulation 130 sandwiched between the extended electrode 158 and the float electrode 126, so that when viewed from the top, the extended electrode 158 of the drain electrode 154 is at least partially overlapped with the float electrode 126. The material forming the second patterned conductive layer 150 can be metal such as aluminum, copper, silver, gold, or any combination thereof, or alloy thereof.

The second insulation layer 160 is disposed on the second patterned conductive layer 150, and can be formed from an organic or inorganic material. Further, when the TFT array substrate has a COA or UHA structure, a third insulation layer (not shown) also can be optionally formed on the second insulation layer 160, and can be formed from an organic material layer 205 such as a color resist or a color filter layer; or formed from an inorganic material. The second insulation layer 160 and the third insulation layer (not shown) can be used to planarize the TFT array substrate, and in another embodiment, also can provide the required filtering function, wherein the second insulation 160 and the third insulation layer (not shown) can be formed from the same material, such as a color filter layer.

In order to electrically contact the extended electrode 158 of the drain electrode 154, the contact hole 170 is generally formed on the second insulation layer 160 and the organic material layer 205, and passes through the second insulation layer 160 and the organic material layer 205 to expose a portion of the extended electrode 158 of the drain electrode 154, so that the pixel electrode 180 can be electrically connected to the extended electrode 158 of the drain electrode 154 through the contact hole 170. For example, the pixel electrode 180 is formed on the portion of the organic material layer 205 and is electrically connected to the extended electrode 158 of the drain electrode 154 through the contact hole 170.

In this embodiment, since the extended electrode 158 of the drain electrode 154 has the float electrode 126 formed thereunder, and thus the extended electrode 158 can be effectively raised. That is, the contact hole 170 does not need to be very deep to expose the extended electrode 158 of the drain electrode 154. Consequently, even though the current etching technique fails to fabricate the contact hole 170 having a high aspect ratio on the color resist, yet since the contract hole 170 does not require a deep depth, the area of the contact hole 170 still can be relatively small, thereby promoting the pixel aperture ratio.

In detail, the float electrode 126 is an electrode which is not electrically connected to any elements. Since the float electrode 126 is not electrically connected to any elements (directly or indirectly), the potential of the float electrode 126 is generally equal or close to the ground potential. Also, since the potential of the float electrode 126 is equal or close to the ground potential, no noticeable capacitance effect between the float electrode 126 and there will be the extended electrode 158 of the drain electrode 154 and the operation of the TFT array substrate will not be affected.

Further, the aforementioned semiconductor layer 140 can further include a first semiconductor area 144 disposed between the first insulation layer 130 and the extended electrode 158 of the drain electrode 154, i.e. the extended electrode 158 of the drain electrode 154 can be partially overlapped with the first semiconductor area 144. In other words, at least one portion of the extended electrode 158 of the drain electrode 154 is stacked on the first semiconductor area 144. Detailedly speaking, a portion of the extended electrode 158 of the drain electrode 154 overlaps the float electrode 126 with the first insulation 130 and the first semiconductor area 144 sandwiched between the extended electrode 158 and the float electrode 126, so that when viewed from the top, the extended electrode 158 of the drain electrode 154 at least partially cover the first semiconductor area 144 and the float electrode 126, thereby further raising the extended electrode 158 of the drain electrode 154.

Concretely speaking, in this embodiment, a height HT between a surface of the substrate 110 and a top surface of the extended electrode 158 exposed through the contact hole 170 is ranged between about 3700 Å and about 14000 Å, a height HP between the surface of the substrate 110 and a bottom surface of the extended electrode 158 contacting the first semiconductor area 144 is ranged between about 1500 Å and about 10000 Å. It should be understood that the aforementioned size is merely stated as an example for explanation, and is not used to limit the embodiments of the present invention. One of ordinary skill in the art may flexibly adjust the height of the extended electrode 158 of the drain electrode 154 in accordance with actual needs.

Figure 3:
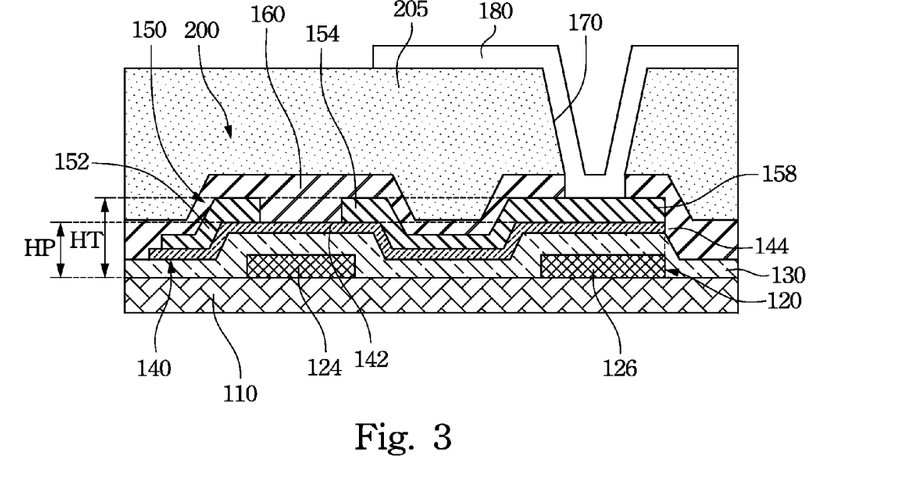
FIG. 3 is a schematic cross-sectional diagram showing a TFT array substrate according to another embodiment of the present invention, wherein the cutting position thereof is similar to that of FIG. 2.

FIG. 3 is a schematic cross-sectional diagram showing a TFT array substrate according to another embodiment of the present invention, wherein the cutting position thereof is similar to that of FIG. 2. The difference between this embodiment and the previous embodiment is that: in the previous embodiment, the channel 142 is separated from the first semiconductor area 144; but in this embodiment, the channel 142 and the first semiconductor area 144 are connected to each other. One of ordinary skill in the art may flexibly choose the method for implementing the channel 142 and the first semiconductor area 144 in accordance with actual needs.

Also, in the embodiment shown in FIG. 3, an edge of the extended electrode 158 of the drain electrode 154 is substantially aligned with an edge of the float electrode 126. However, the present invention is not limited thereto. One of ordinary skill in the art may flexibly choose the relative position between the float electrode 126 and the extended electrode 158 of the drain electrode 154 in accordance with actual needs.

Figure 4:
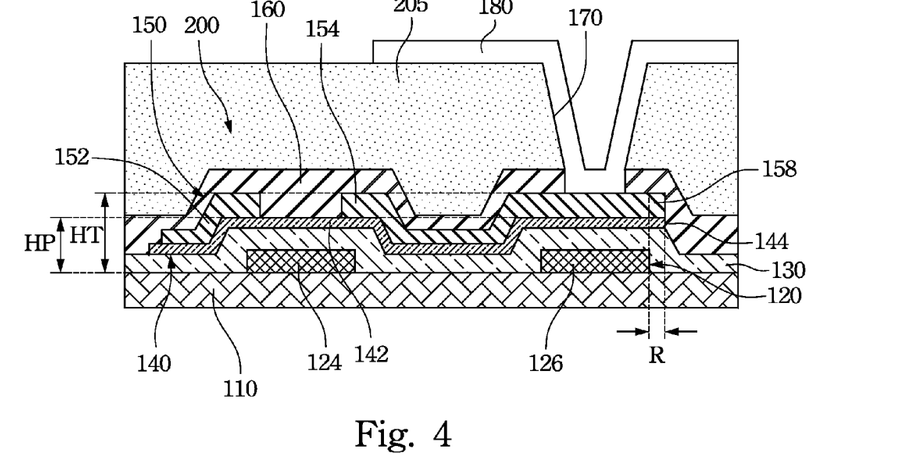
FIG. 4 is a schematic cross-sectional diagram showing a TFT array substrate according to another embodiment of the present invention, wherein the cutting position thereof is similar to that of FIG. 2.
Figure 5:
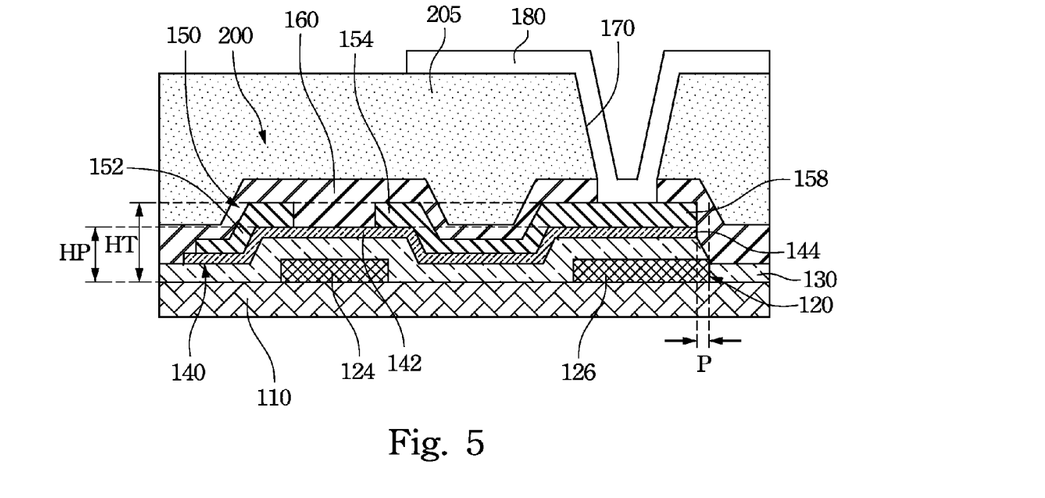
FIG. 5 is a schematic cross-sectional diagram showing a TFT array substrate according to another embodiment of the present invention, wherein the cutting position thereof is similar to that of FIG. 2.

For example, in another embodiment, a projection position of an edge of the extended electrode 158 located away from the drain electrode 154 protrudes a distance R from an edge of the float electrode 126 located away from the gate electrode 124, wherein the distance R is ranged between about 0 μm and about 10 μm, as shown in FIG. 4. Alternatively, a projection position of an edge of the extended electrode 158 located away from the drain electrode 154 shrinks a distance P from an edge of the float electrode 126 located away from the gate electrode 124, and the distance P is ranged between about 0 μm and about 10 μm, as shown in FIG. 5.

Besides using the float electrode 126 to raise the extended electrode 158 of the drain electrode 154, one of ordinary skill in the art may optionally omit the float electrode 126, and merely use the first semiconductor area 144 to raise the extended electrode 158 of the drain electrode 154. In the below, FIG. 6 is used as an example to concretely explaining the aforementioned technical contents.

Figure 6:
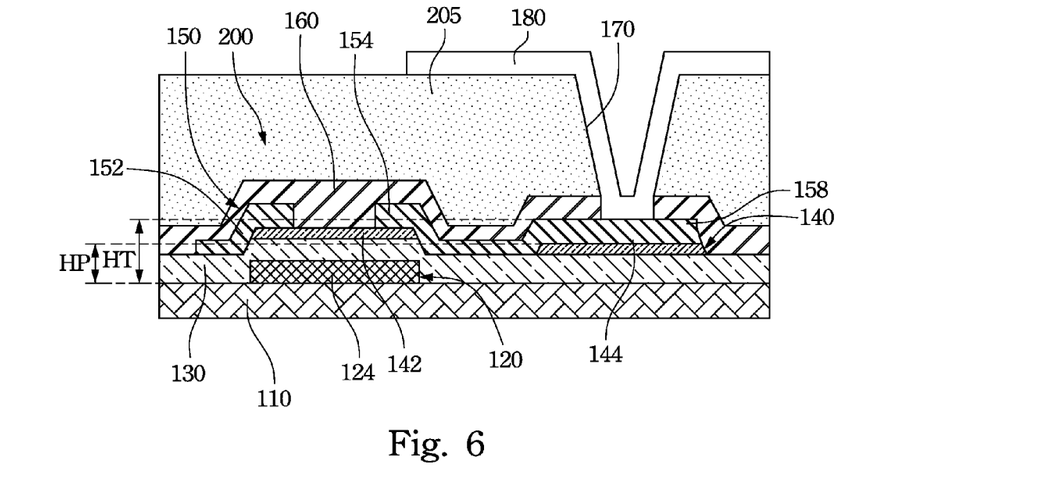
FIG. 6 is a schematic cross-sectional diagram showing a TFT array substrate according to another embodiment of the present invention, wherein the cutting position thereof is similar to that of FIG. 2.

FIG. 6 is a schematic cross-sectional diagram showing a TFT array substrate according to another embodiment of the present invention, wherein the cutting position thereof is similar to that of FIG. 2. The difference between this embodiment and the previous embodiments is that: this embodiment does not dispose the float electrode on the substrate, but merely disposes the first semiconductor area 144 between the first insulation layer 130 and the extended electrode 158 of the drain electrode 154. Detailedly speaking, a height HT between a surface of the substrate 110 and a top surface of the extended electrode 158 exposed through the contact hole 170 is ranged between about 3200 Å and about 13500 Å, and a height HP between a surface of the substrate 110 and a bottom surface of the extended electrode 158 contacting the first semiconductor area 144 is ranged between about 1000 Å and about 9500 Å.

In other words, one of ordinary skill in the art should flexibly choose the structure stacked under the extended electrode 158 of the drain electrode 154 in accordance with actual needs, and it is not necessary to choose the float electrode 126. Concretely speaking, one of ordinary skill in the art may choose only using the float electrode 126; only using the first semiconductor area 144; or simultaneously using both of the float electrode 126 and the first semiconductor area 144 to raise the extended electrode 158 of the drain electrode 154.

Figure 7:
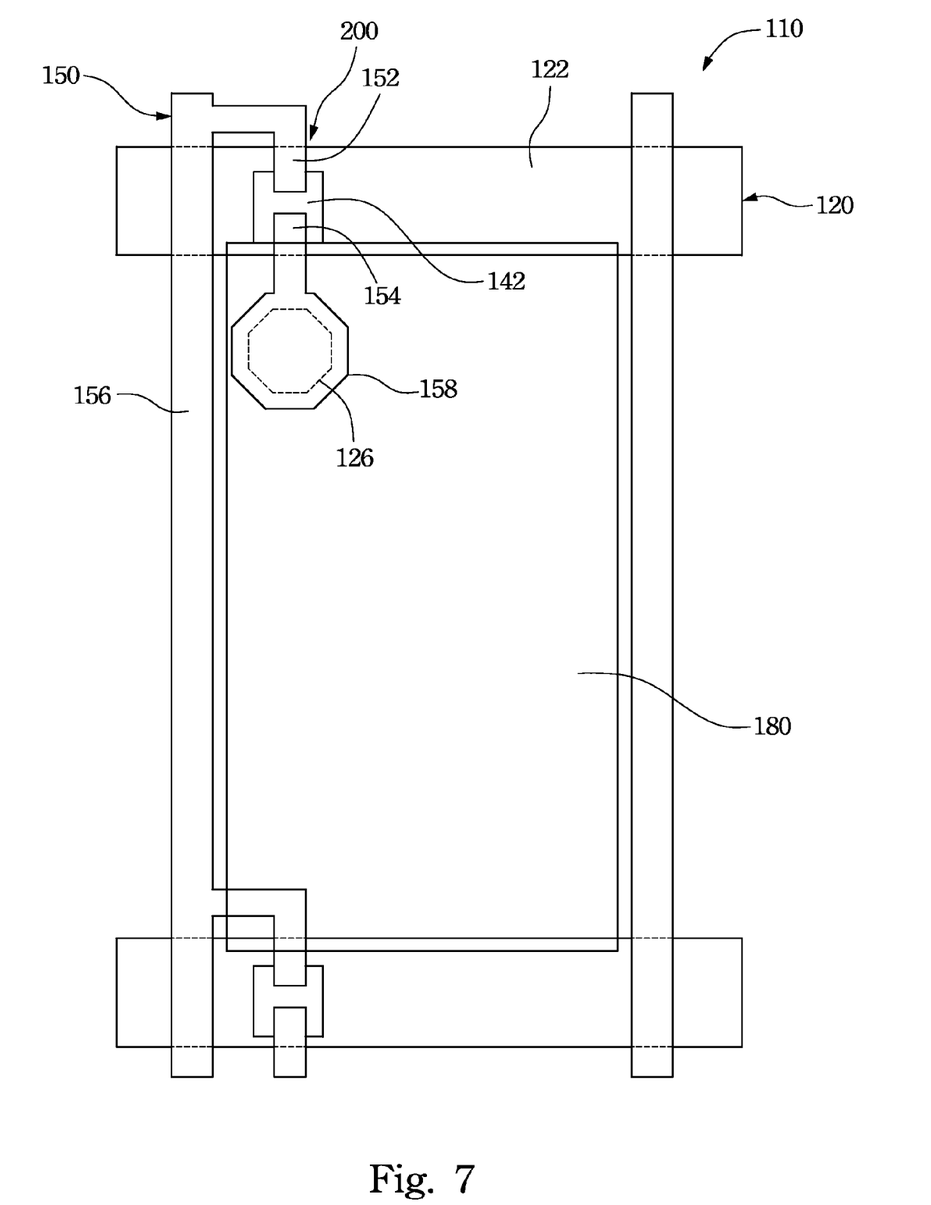
FIG. 7 is a schematic top view showing a TFT array substrate according to another embodiment of the present invention.
Figure 8:
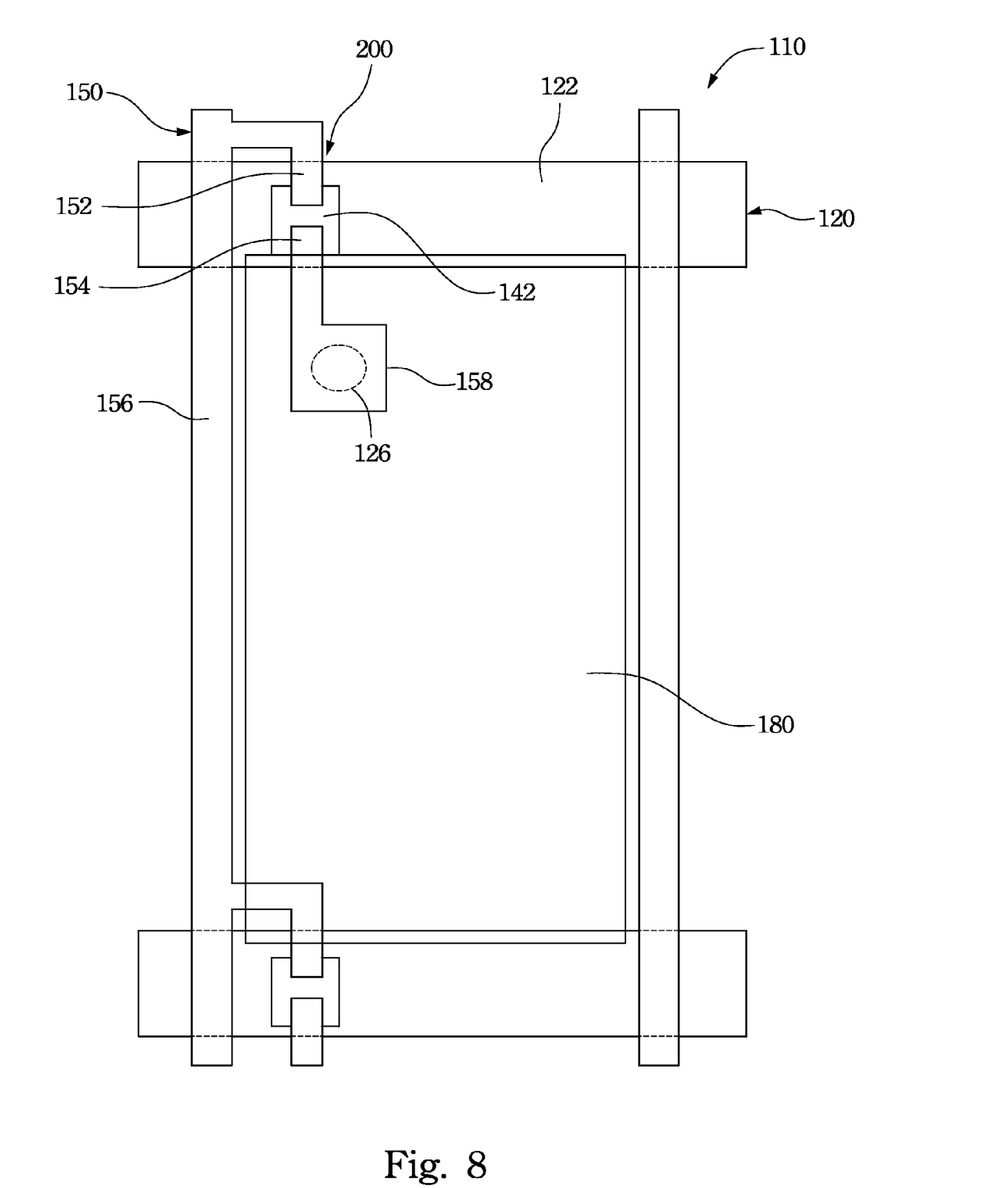
FIG. 8 is a schematic top view showing a TFT array substrate according to another embodiment of the present invention.

Further, although the shape of the float 126 depicted in FIG. 1 substantially is a square, yet the embodiments of the present invention are not limited thereto. The shape of the float electrode 126 also can be a polygon as shown in FIG. 7; an ellipse as shown in FIG. 8; or a circle. One of ordinary skill in the art may flexibly choose the appropriate shape in accordance with actual needs.

Figure 9:
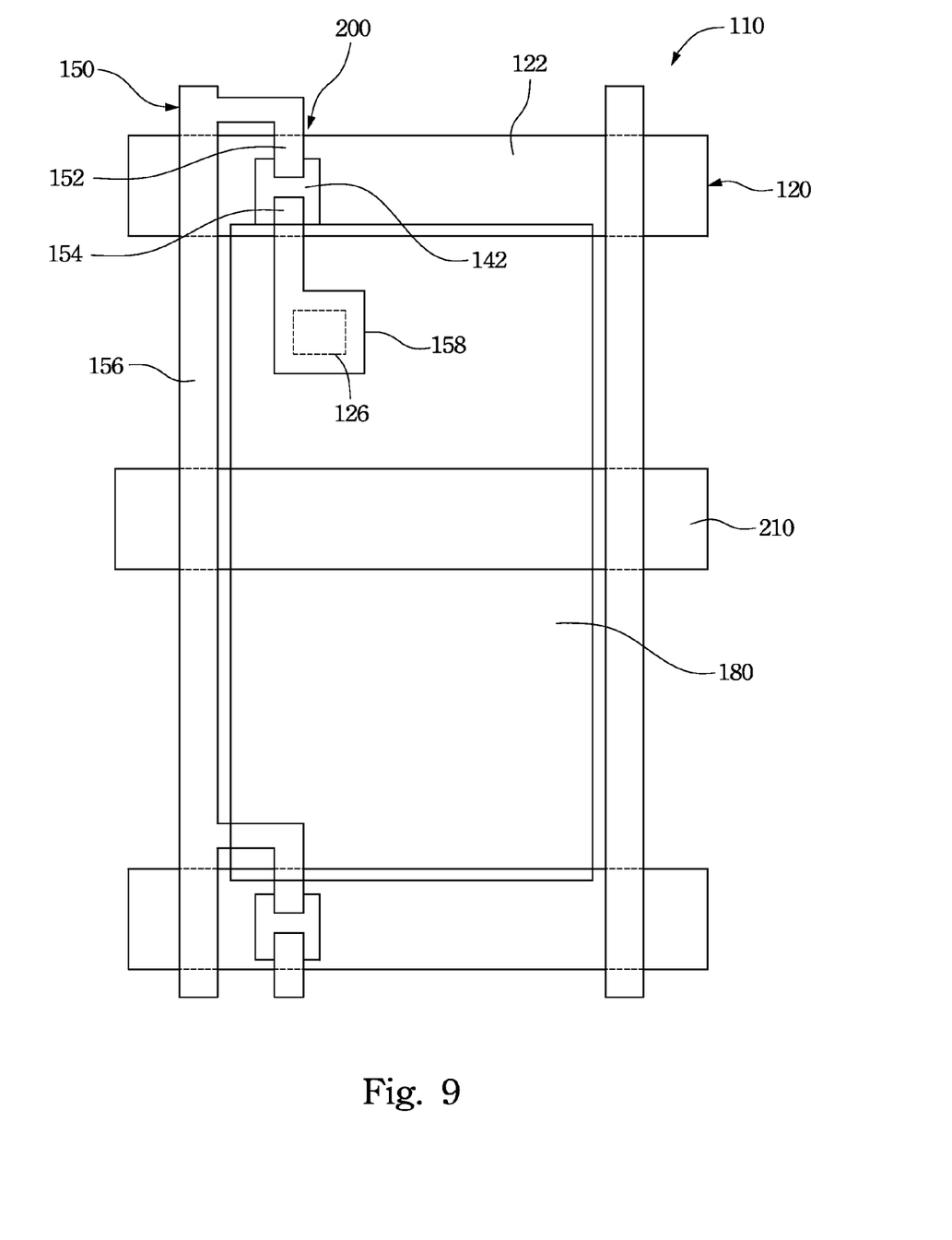
FIG. 9 is a schematic top view showing a TFT array substrate according to another embodiment of the present invention.

It will be apparent to those skilled in the art that various modifications and variations can be made to the structure of the present invention without departing from the scope or spirit of the invention. For example, one of ordinary skill in the art also can integrate a common electrode 210 into the TFT array substrate as shown in FIG. 9 without departing from the scope or spirit of the invention. In view of the foregoing, it is intended that the present invention cover modifications and variations of this invention provided they fall within the scope of the following claims and their equivalents.

What is claimed is:

1. A thin film transistor (TFT) array substrate, comprising:
   a substrate;
   a first patterned conductive layer disposed on the substrate, wherein the first patterned conductive layer comprises a scan line, a gate electrode, and a float electrode, and the gate electrode is electrically connected to the scan line;
   a first insulation layer disposed on the first patterned conductive layer;
   a semiconductor layer disposed on the first insulation layer, wherein the semiconductor layer comprises a channel area and a first semiconductor area, wherein the channel area and the first semiconductor area are formed as separated pieces and are spaced apart from each other;
   a second patterned conductive layer disposed on the first insulation layer, the second patterned conductive layer comprising a source electrode, a drain electrode, a data line crossing the scan line, and an extended electrode of the drain electrode, wherein the gate electrode, the source electrode, the drain electrode, and the channel area constructing a TFT, wherein the source electrode is electrically connected to the data line, and the extended electrode of the drain electrode is partially overlapped with the float electrode, and the extended electrode of the drain electrode and the drain electrode are integrally formed as one piece;
   a second insulation layer disposed on the second patterned conductive layer;
   a contact hole passing through the second insulation layer and exposing a portion of the extended electrode of the drain electrode; and
   a pixel electrode electrically connected to the extended electrode of the drain electrode through the contact hole;
   wherein the first semiconductor area and the channel area are separated.

2. The TFT array substrate of claim 1, wherein the first semiconductor area is located between the extended electrode of the drain electrode and the first insulation layer.

3. The TFT array substrate of claim 1, wherein an edge of the extended electrode of the drain electrode is substantially aligned with an edge of the float electrode.

4. The TFT array substrate of claim 1, wherein a projection position of an edge of the extended electrode located away from the drain electrode shrinks a distance from an edge of the float electrode located away from the gate electrode, and the distance is ranged between about 0 µm and about 10 µm.

5. The TFT array substrate of claim 1, wherein a projection position of an edge of the extended electrode located away from the drain electrode protrudes a distance from an edge of the float electrode located away from the gate electrode, and the distance is ranged between about 0 µm and about 10 µm.

6. The TFT array substrate of claim 1, wherein a height between a surface of the substrate and a top surface of the extended electrode exposed through the contact hole is ranged between about 3700 Å and about 14000 Å.

7. The TFT array substrate of claim 2, wherein a height between a surface of the substrate and a bottom surface of the extended electrode contacting the first semiconductor area is ranged between about 1500 Å and about 10000 Å.

8. The TFT array substrate of claim 1, wherein the float electrode is formed in a shape of square, polygon, ellipse, or circle.

9. The TFT array substrate of claim 1, wherein the second insulation layer is formed from an organic or inorganic material.

10. The TFT array substrate of claim 1, further comprising a third insulation layer disposed above the second insulation layer.

11. The TFT array substrate of claim 10, wherein the third insulation layer is formed from an organic or inorganic material.

12. The TFT array substrate of claim 10, wherein the third insulation layer is a color filter layer.

13. The TFT array substrate of claim 1, wherein the second insulation layer is a color filter layer.

14. A TFT array substrate, comprising:
a substrate;
a first patterned conductive layer disposed on the substrate, wherein the first patterned conductive layer comprises a scan line and a gate electrode, and the gate electrode is electrically connected to the scan line;
a first insulation layer disposed on the first patterned conductive layer;
a semiconductor layer disposed on the first insulation layer, wherein the semiconductor layer comprises a channel area and a first semiconductor area, wherein the channel area and the first semiconductor area are formed as separated pieces and are spaced apart from each other;
a second patterned conductive layer disposed on the first insulation layer, the second patterned conductive layer comprising a source electrode, a drain electrode, a data line crossing the scan line, and an extended electrode of the drain electrode, wherein the gate electrode, the source electrode, the drain electrode, and the channel area constructing a TFT, wherein the source electrode is electrically connected to the data line, and the extended electrode of the drain electrode is partially overlapped with the first semiconductor area, and the extended electrode of the drain electrode and the drain electrode are integrally formed as one piece;
a second insulation layer disposed on the second patterned conductive layer;
a contact hole passing through the second insulation layer and exposing a portion of the extended electrode of the drain electrode; and
a pixel electrode electrically connected to the extended electrode of the drain electrode through the contact hole.

15. The TFT array substrate of claim 14, wherein a height between a surface of the substrate and a top surface of the extended electrode exposed through the contact hole is ranged between about 3200 Å and about 13500 Å.

16. The TFT array substrate of claim 14, wherein a height between a surface of the substrate and a bottom surface of the extended electrode contacting the first semiconductor area is ranged between about 1000 Å and about 9500 Å.

17. The TFT array substrate of claim 14, wherein the second insulation layer is formed from an organic or inorganic material.

18. The TFT array substrate of claim 14, further comprising a third insulation layer disposed above the second insulation layer.

19. The TFT array substrate of claim 18, wherein the third insulation layer is formed from an organic or inorganic material.

20. The TFT array substrate of claim 18, wherein the third insulation layer is a color filter layer.

21. The TFT array substrate of claim 14, wherein the second insulation layer is a color filter layer.

* * * * *